(12) United States Patent
Ota et al.

(10) Patent No.: US 10,867,561 B2
(45) Date of Patent: Dec. 15, 2020

(54) DISPLAY APPARATUS

(71) Applicant: CANON KABUSHIKI KAISHA, Tokyo (JP)

(72) Inventors: Yasuharu Ota, Kawasaki (JP); Yasushi Matsuno, Fujisawa (JP); Yu Maehashi, Yokohama (JP); Hiromasa Tsuboi, Tama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/391,674

(22) Filed: Apr. 23, 2019

(65) Prior Publication Data

US 2019/0355311 A1 Nov. 21, 2019

(30) Foreign Application Priority Data

May 17, 2018 (JP) .................. 2018-095634

(51) Int. Cl.
*G09G 3/3291* (2016.01)
*G09G 3/3266* (2016.01)
*G09G 3/3233* (2016.01)
*H01L 27/32* (2006.01)

(52) U.S. Cl.
CPC ......... *G09G 3/3291* (2013.01); *G09G 3/3233* (2013.01); *G09G 3/3266* (2013.01); *H01L 27/3276* (2013.01); *G09G 2300/0426* (2013.01); *G09G 2300/0452* (2013.01); *G09G 2310/08* (2013.01)

(58) Field of Classification Search
CPC .. G09G 3/3291; G09G 3/3233; G09G 3/3266; G09G 2310/0243; G09G 2310/0278; G09G 2310/02; G09G 2310/08; G09G 2310/0202; H01L 27/3276

See application file for complete search history.

(56) References Cited

U.S. PATENT DOCUMENTS

| 10,541,286 | B2 * | 1/2020 | Park ................. H01L 29/42312 |
| 2003/0043132 | A1 * | 3/2003 | Nakamura ........... G09G 3/2011 345/204 |
| 2012/0062135 | A1 * | 3/2012 | Tamaki .................. H05B 33/08 315/210 |
| 2014/0035890 | A1 * | 2/2014 | Jinta .................... G09G 3/3233 345/204 |
| 2017/0263173 | A1 * | 9/2017 | Lin ....................... G09G 3/2003 |

FOREIGN PATENT DOCUMENTS

JP 2012-255873 A 12/2012

* cited by examiner

*Primary Examiner* — Sardis F Azongha
(74) *Attorney, Agent, or Firm* — Venable LLP

(57) ABSTRACT

A display apparatus in which selection circuits and display blocks are arranged is provided. Each of the display blocks include signal lines extending in a column direction, and pixels connected to the signal lines and arranged in a matrix in the column direction and in a row direction crossing the column direction. Each of the selection circuits selects a signal line in a predetermined order to supply an image signal among the signal lines such that the image signal is written in each of the pixels arranged in the row direction among the pixels. A time to select at least one signal line among the signal lines and supply the image signal is different from a time to select a signal line other than the at least one signal line among the signal lines and supply the image signal.

13 Claims, 9 Drawing Sheets

DISPLAY APPARATUS

BACKGROUND OF THE INVENTION

Field of the Invention

The present invention relates to a display apparatus.

Description of the Related Art

A display apparatus including a light emitting element that uses, as a light emitting layer, organic electroluminescence (EL) caused by an organic material that emits light has received attention. Japanese Patent Laid-Open No. 2012-255873 shows an arrangement of a display apparatus in which 1-input N-output type selection circuits are provided, a plurality of signal lines are divided into blocks corresponding to the selection circuits, and signals are supplied to pixels while switching the output destination in each block. When such selection circuits are used, the number of outputs of a driving circuit and output circuits can be decreased as compared to a case in which signals are supplied from a driving circuit to all signal lines.

In a case in which, for example, the image signal is supplied while switching the signal line by the selection circuit, and the difference between the signal voltages of the image signals supplied to the signal lines selected subsequently is large, it is sometimes impossible to ensure the time until the image signal transitions to a desired signal voltage. If the time until the image signal transitions to the desired signal voltage cannot be ensured, the correct image signal cannot be supplied to the signal line, and the quality of a displayed image may lower. In addition, if the setup time to supply the image signal to the signal line is prolonged to reliably supply the image signal to the signal line, the frame rate of displaying an image on the display apparatus may lower.

SUMMARY OF THE INVENTION

Some embodiments of the present invention provide a technique advantageous in displaying an image on a display apparatus.

According to some embodiment, a display apparatus in which a plurality of selection circuits and a plurality of display blocks are arranged such that one display block corresponds to one selection circuit, wherein each of the plurality of display blocks includes a plurality of signal lines extending in a column direction, and a plurality of pixels connected to the plurality of signal lines and arranged in a matrix in the column direction and in a row direction crossing the column direction, each of the plurality of selection circuits selects a signal line in a predetermined order to supply an image signal among the plurality of signal lines such that the image signal is written in each of the pixels arranged in the row direction among the plurality of pixels, and a time to select at least one signal line among the plurality of signal lines and supply the image signal is different from a time to select a signal line other than the at least one signal line among the plurality of signal lines and supply the image signal, is provided.

Further features of the present invention will become apparent from the following description of exemplary embodiments (with reference to the attached drawings).

DESCRIPTION OF THE EMBODIMENTS

Detailed embodiments of a display apparatus according to the present invention will now be described with reference to the accompanying drawings. Note that in the following description and drawings, common reference numerals denote common components throughout a plurality of drawings. Hence, the common components will be described by cross-referencing with the plurality of drawings, and a description of components denoted by common reference numerals will appropriately be omitted.

Figure 1:
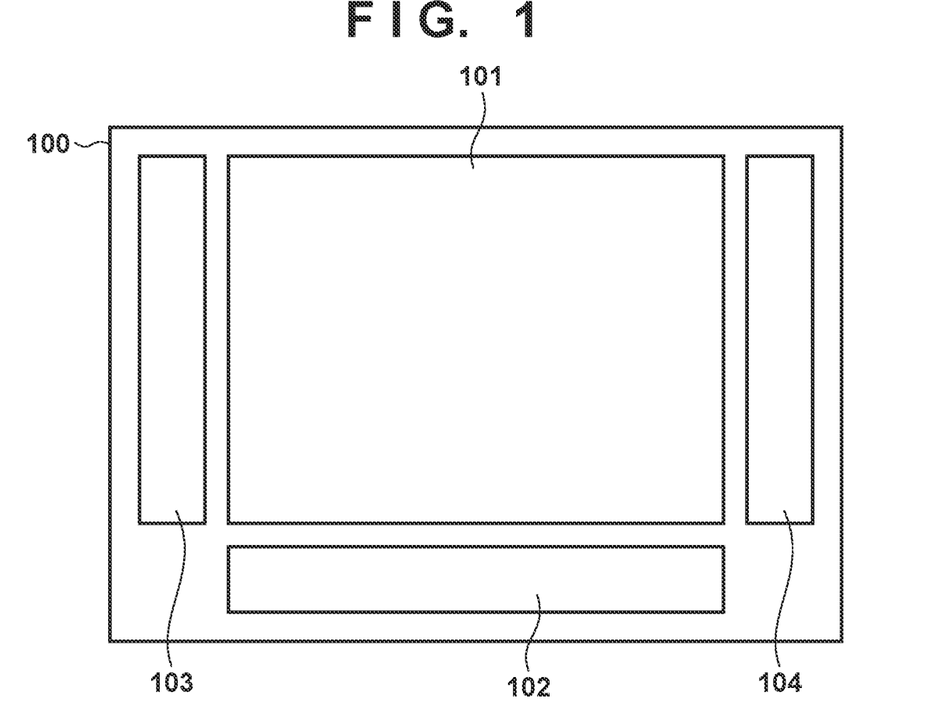
FIG. 1 is a view showing an example of the arrangement of a display apparatus according to the embodiment of the present invention.

The arrangement of a display apparatus according to an embodiment of the present invention and a method of driving the same will be described with reference to FIGS. 1 to 10. FIG. 1 is an overall conceptual view showing an example of the arrangement of a display apparatus 100 according to the embodiment of the present invention. The display apparatus 100 is used as an organic light emitting display including an organic light emitting element that uses, as a light emitting layer, organic electroluminescence (EL) caused by an organic material that emits light.

The display apparatus 100 includes a display region 101, a horizontal driving circuit 102, a vertical driving circuit 103, and a timing generation unit 104. In the display region 101, pixels (also called sub-pixels) of three different emission colors, that is, red (R), green (G), and blue (B) are arranged on a matrix, and the color and luminance of one pixel in an image are expressed by combing the three color pixels. In each pixel, an organic light emitting element is arranged to emit light of red (R), green (G), or blue (B), and a driving circuit configured to drive the organic light emitting element is arranged for each organic light emitting element. In each pixel, the organic light emitting element may directly emit light of red (R), green (G), or blue (B), or each color may be displayed by a combination of an organic light emitting element configured to emit white light and a color filter of each color. In this embodiment, an example in which the red (R), green (G), and blue (B) pixels are arranged will be described. However, the present invention is not limited to this. For example, in a display apparatus that displays only a single color, a pixel including an organic light emitting element of one color may form one pixel in an image. The horizontal driving circuit 102 is a circuit configured to output a signal of video data such as luminance information to each pixel. The vertical driving circuit 103 is a circuit configured to output a signal used to control the driving circuit of each pixel. The timing generation unit 104 is a circuit configured to control a driving timing or the like, and is connected to the horizontal driving circuit 102 and the vertical driving circuit 103 via wiring lines (not shown) or the like.

The pixels used in the display apparatus 100 according to this embodiment will be described next. As described above, the pixels configured to emit light components of red (R), green (G), and blue (B) are arranged. For the descriptive convenience, in a pixel 110 shown in FIG. 2, a driving circuit for an organic light emitting element 111 of one of the three colors is shown. In the arrangement shown in FIG. 2, the pixel 110 includes the current driven type organic light emitting element 111 that changes emission luminance in accordance with a current flowing to the light emitting element, and a driving circuit configured to drive the organic light emitting element 111. The cathode electrode of the organic light emitting element 111 is connected to a common power supply 125 that is commonly arranged for the organic light emitting elements of all pixels arranged in the display region 101.

Figure 2:
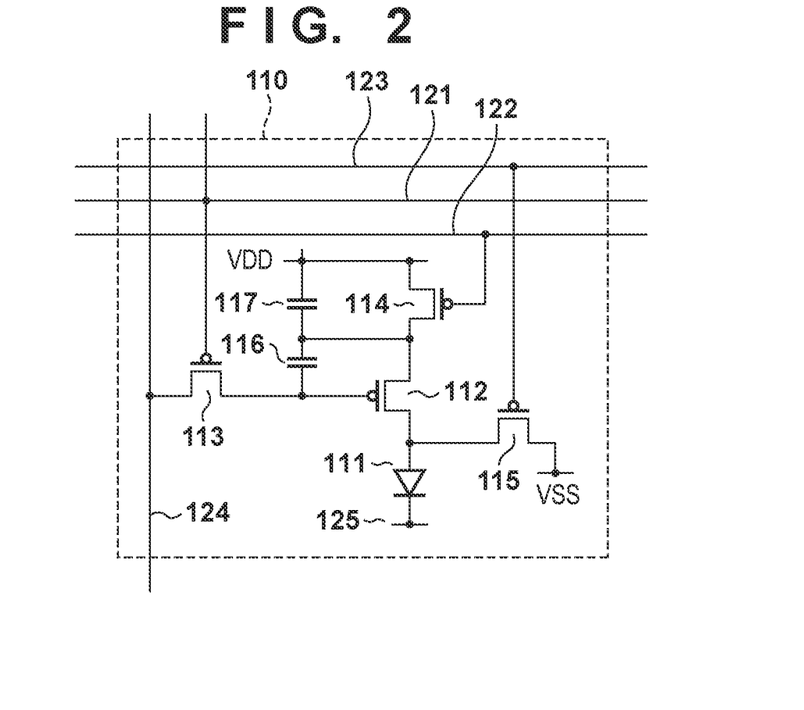
FIG. 2 is an equivalent circuit diagram of a pixel of the display apparatus shown in FIG. 1.

The driving circuit configured to drive the organic light emitting element 111 includes a driving transistor 112, a selection transistor 113, switching transistors 114 and 115, and capacitive elements 116 and 117. In this embodiment, p-channel transistors (PMOS transistors) are used as the driving transistor 112, the selection transistor 113, and the switching transistors 114 and 115.

The driving transistor 112 is connected in series with the anode electrode of the organic light emitting element 111, thereby supplying a driving current to the organic light emitting element 111. More specifically, the drain electrode of the driving transistor 112 is connected to the anode electrode of the organic light emitting element 111.

The selection transistor 113 has the gate electrode connected to a scanning line 121, the source electrode connected to a signal line 124, and the drain electrode connected to the gate electrode of the driving transistor 112. A signal is applied from the vertical driving circuit 103 to the gate electrode of the selection transistor 113 via the scanning line 121.

The switching transistor 114 has the gate electrode connected to a scanning line 122, the source electrode connected to a power supply potential VDD, and the drain electrode connected to the source electrode of the driving transistor 112. A signal used to control the light emission of the organic light emitting element 111 is applied from the vertical driving circuit 103 to the gate electrode of the switching transistor 114 via the scanning line 122. The switching transistor 115 has the gate electrode connected to a scanning line 123, the source electrode connected to a power supply potential VSS, and the drain electrode connected to the anode electrode of the organic light emitting element 111. A signal used to control the potential of the anode electrode of the organic light emitting element 111 is applied from the vertical driving circuit 103 to the gate electrode of the switching transistor 115 via the scanning line 123.

The capacitive element 116 is connected between the gate electrode and the source electrode of the driving transistor 112. The capacitive element 117 is connected between the first power supply potential VDD and the source electrode of the driving transistor 112.

In the arrangement shown in FIG. 2, a PMOS transistor is used for each transistor. However, the present invention is not limited to this, and an arrangement using n-channel transistors (NMOS transistors) may also be employed. In addition, the driving circuit is not limited to a so-called 4Tr2C circuit arrangement including four transistors and two capacitive elements. In addition, as each transistor, a transistor formed on a silicon wafer may be used, or a thin film transistor formed on a semiconductor film deposited on a glass substrate may be used.

In the pixel 110, the selection transistor 113 is rendered conductive in response to a write signal applied from the vertical driving circuit 103 to the gate electrode via the scanning line 121. By this operation, an image signal or a reference voltage according to luminance information is sampled from the signal line 124. When the reference voltage is sampled from the signal line 124, a threshold voltage variation in the driving transistor 112 of each pixel can be corrected, and a luminance variation in each pixel caused by the threshold voltage variation can be reduced. The image signal or the reference voltage is applied to the gate electrode of the driving transistor 112 and also held by the capacitive element 116.

The driving transistor 112 receives a current supplied from the power supply potential VDD via the switching transistor 114, and causes the organic light emitting element 111 to emit light by current driving. At this time, since the amount of the current flowing to the organic light emitting element 111 is determined by the voltage held by the capacitive element 116, the light emission amount of the organic light emitting element 111 can be controlled. The switching transistor 114 is rendered conductive when the signal used to control light emission is applied from the vertical driving circuit 103 to the gate electrode via the scanning line 122. That is, the switching transistor 114 has a function of controlling light emission and non-emission of the organic light emitting element 111.

When the signal used to control the potential of the anode electrode of the organic light emitting element 111 is applied from the vertical driving circuit 103 to the gate electrode of the switching transistor 115 via the scanning line 123, the switching transistor 115 selectively supplies the power supply potential VSS to the anode electrode.

Figure 3A:
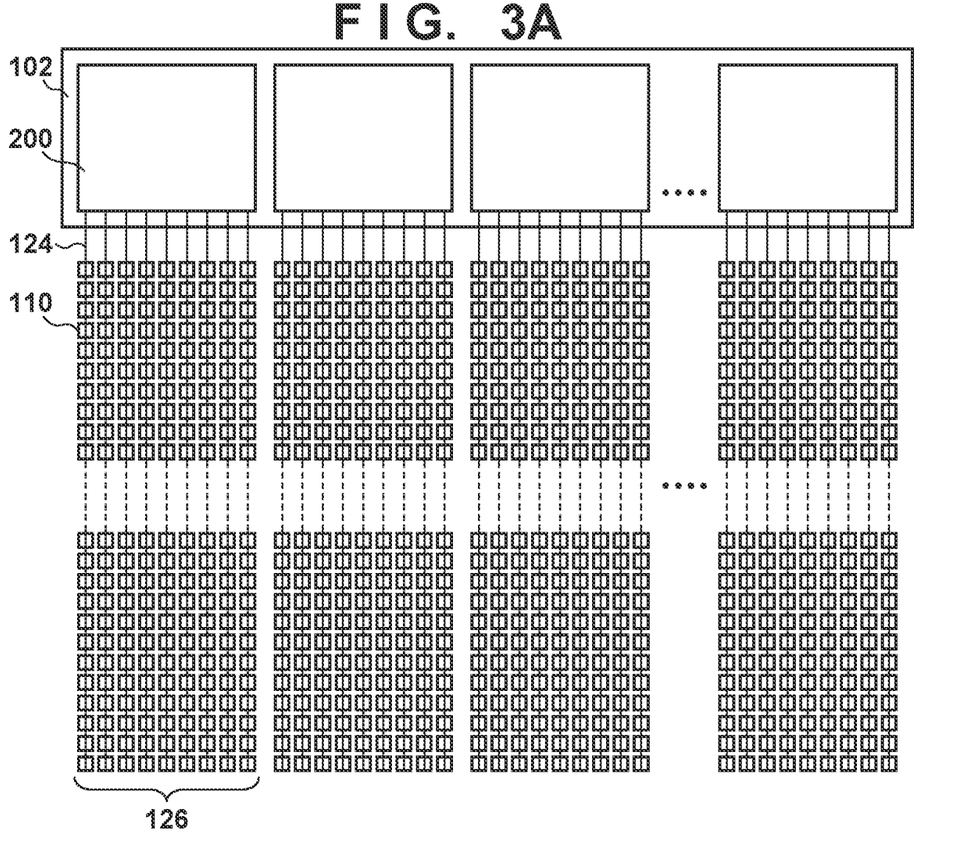
FIGS. 3A and 3B are views showing an example of the arrangement of the horizontal driving circuit of the display apparatus shown in FIG. 1.
Figure 3B:
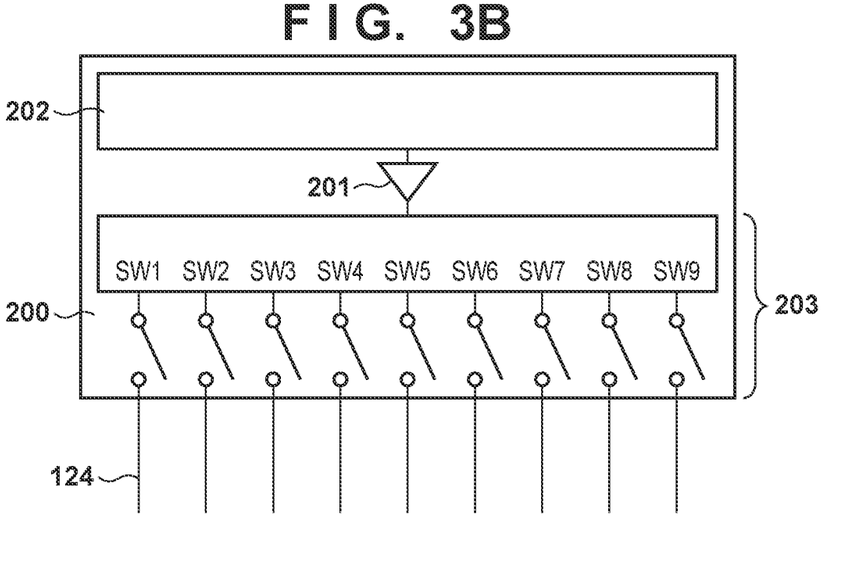

An arrangement for performing transmission to the signal line 124 that supplies an image signal as luminance information to each pixel 110 will be described next with reference to FIGS. 3A and 3B. In this embodiment, as shown in FIG. 3A, the signal lines 124 and the pixels 110 are divisionally controlled in a plurality of display blocks 126. Each of the plurality of display blocks 126 includes a plurality of signal lines 124 extending in the column direction, and a plurality of pixels 110 each connected to any one of the plurality of signal lines 124 and arranged in a matrix in the column direction and in the row direction crossing the column direction. An image signal is written in each pixel 110 via the signal line 124. In FIG. 3A, the direction in which the signal lines 124 extend will be referred to as the column direction, and the direction crossing the column direction will be referred to as the row direction. Additionally, a plurality of selection circuits 200 each configured to select the signal line 124 used to supply the image signal are arranged between the horizontal driving circuit 102 and the display blocks 126 in the display apparatus 100. The plurality of selection circuits 200 and the plurality of display blocks 126 are arranged such that one display block 126 corresponds to one selection circuit 200. As shown in FIG. 3B, the selection circuit 200 includes a switching unit 203 including a plurality of switches SW, a signal output buffer 201, and a signal generation unit 202.

Let M be the number of signal lines 124 output from one selection circuit 200, and N be the number of selection circuits 200. In this case, the total number of signal lines 124 is M×N. The arrangement shown in FIGS. 3A and 3B shows an example in which each of the plurality of display blocks 126 includes nine signal lines 124. For this reason, in one selection circuit 200, to switch the nine signal lines 124 to enable output of an image signal, the switching unit 203 is provided with nine switches SW configured to select the signal line 124 in the one selection circuit 200, as shown in FIG. 3B. Additionally, in a case of the arrangement shown FIGS. 3A and 3B, an image signal write operation is performed nine times using the switches SW in one horizontal scanning period in which the image signals are supplied to the pixels 110 arranged in the row direction among the plurality of pixels 110 arranged in one display block 126.

Figure 4:
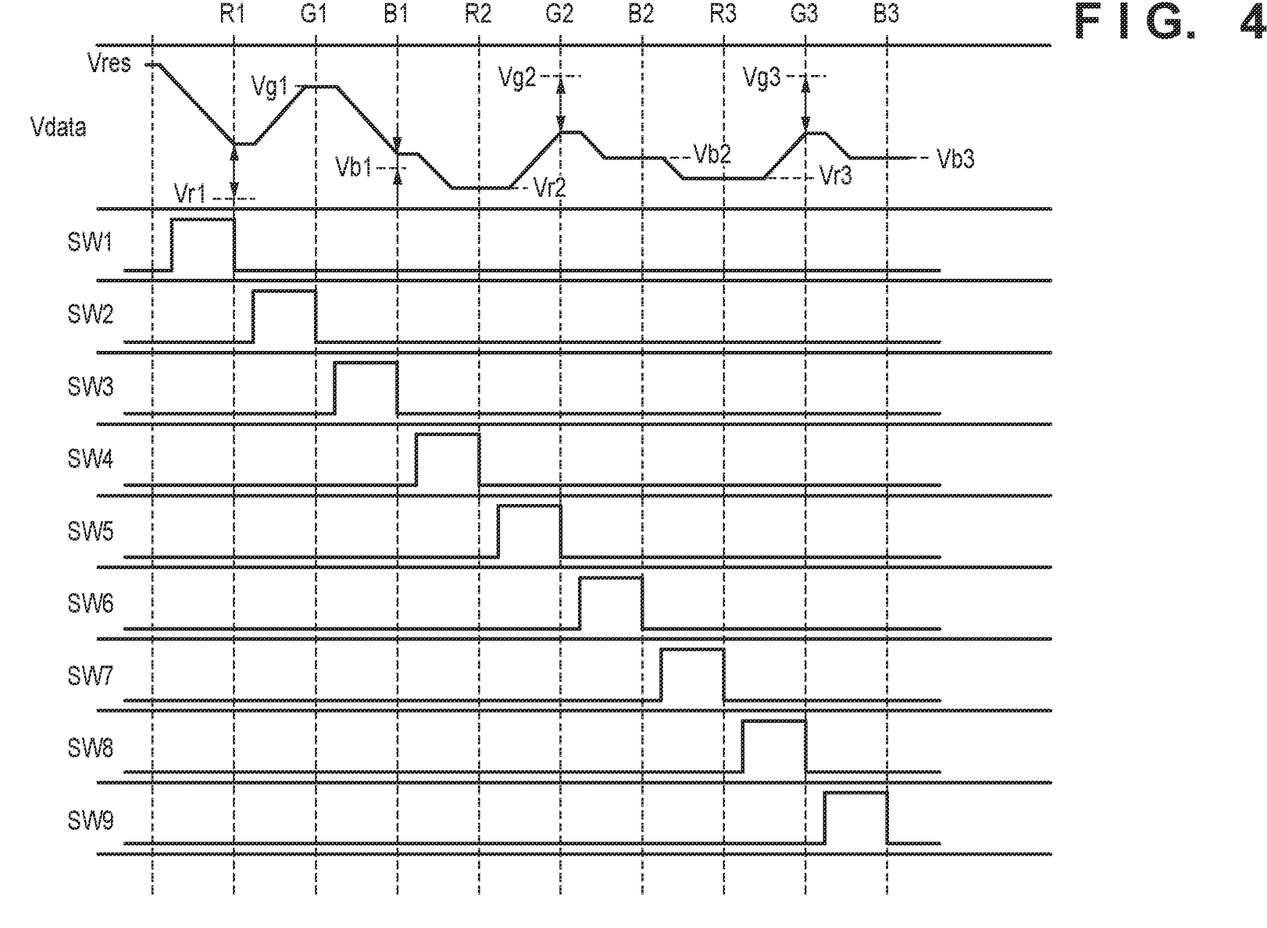
FIG. 4 is a driving timing chart of a display apparatus according to a comparative example.

A problem in this embodiment will be described here with reference to FIG. 4. FIG. 4 is a timing chart showing a comparative example of a driving method using the selection circuit 200. In one horizontal scanning period, image signals are supplied to nine pixels 110 arranged on one row among the plurality of pixels 110. In FIG. 4, "Vdata" represents the signal voltage of the image signal supplied to the signal line 124, and "SW1" to "SW9" represent the operation states of the switches SW configured to select the nine signal lines 124 and supply the image signals. Here, one horizontal scanning period can be a period from the start of the operation of supplying the signal voltage to one of the signal lines 124 first in one row (nth row) to the start of the operation of supplying the signal voltage to one of the signal lines 124 first in the next row ((n+1)th row).

In the driving method shown in FIG. 4, the switches SW1 to SW9 configured to select the signal lines 124 are sequentially turned on, and the corresponding signal lines 124 are selected. Accordingly, the signal voltages of the image signals are sequentially supplied to the corresponding signal lines 124. In one horizontal scanning period, the selection circuit 200 turns on each of the switches SW1 to SW9 once, selects each signal line once, and supplies the image signal.

The signal voltage of the image signal generated by the signal generation unit 202 and supplied to the signal line 124 via the signal output buffer 201 and the switch SW is settled in a time according to a time constant derived from the parasitic resistance or parasitic capacitance of the signal line 124 and the like. For this reason, to settle the signal voltage to the desired voltage of the image signal after the switches SW1 to SW9 are turned on, the larger the voltage difference between the signal voltage before each switch SW is turned on and the desired signal voltage to be supplied is, the longer the needed setup time is.

The driving method of the comparative example and the driving method according to this embodiment shown in FIGS. 5 to 10 will be described here assuming that the switch SW1 selects the signal line 124 to which a pixel R1 (red) is connected, the switch SW2 selects the signal line 124 to which a pixel G1 (green) is connected, the switch SW3 selects the signal line 124 to which a pixel B1 (blue) is connected, the switch SW4 selects the signal line 124 to which a pixel R2 (red) is connected, the switch SW5 selects the signal line 124 to which a pixel G2 (green) is connected, the switch SW6 selects the signal line 124 to which a pixel B2 (blue) is connected, the switch SW7 selects the signal line 124 to which a pixel R3 (red) is connected, the switch SW8 selects the signal line 124 to which a pixel G3 (green) is connected, and the switch SW9 selects the signal line 124 to which a pixel B3 (blue) is connected among the plurality of pixels 110. Additionally, as for the desired signal voltages of image signals written in the pixels 110 via the signal lines 124, a signal voltage Vr1 is written in the pixel R1, a signal voltage Vg1 is written in the pixel G1, a signal voltage Vb1 is written in the pixel B1, a signal voltage Vr2 is written in the pixel R2, a signal voltage Vg2 is written in the pixel G2, a signal voltage Vb2 is written in the pixel B2, a signal voltage Vr3 is written in the pixel R3, a signal voltage Vg3 is written in the pixel G3, and a signal voltage Vb3 is written in the pixel B3. The image displayed on the display apparatus 100 is not an image with a high spatial frequency such as a fine checkered pattern or stripe pattern which needs to change the color or luminance on a pixel basis but an image such as a landscape image that gradually changes the color or luminance over a plurality of pixels. Hence, if the pixels 110 adjacent to each other have the same emission color, the signal voltages of image signals rarely have a difference. On the other hand, if the pixels 110 adjacent to each other have different emission colors, a difference is generated between the signal voltages of image signals in accordance with the luminance ratio of the pixels 110 of the three emission colors according to the displayed color.

In the driving method according to the comparative example shown in FIG. 4, the switch SW1, the switch SW2, . . . , the switch SW9 are turned on in this order, and the signal lines 124 to supply the image signals are selected. Hence, when focus is placed on the emission colors of the pixels 110 of the connection destinations, the image signals are supplied in the order of red, green, blue, red, green, blue, red, green, and blue. When the image signals are written in this order in the pixels 110 (pixels R1 to B3), the signal voltages are written continuously in the pixels 110 of different emission colors from the first column to the ninth column. For this reason, in some cases, the difference between the signal voltages of the image signals becomes large between two columns to which the image signals are continuously supplied. If the difference between the signal voltages of the image signals is large, the time until the image signal obtains the desired signal voltage becomes long, the signal voltage does not reach the desired signal voltage within the time in which the switch SW is on, and the switch SW is turned off in some cases. In the arrangement shown in FIG. 4, the difference between the signal voltage Vg1 of the image signal supplied to the pixel G1 and the signal voltage Vb1 of the image signal of the pixel B1 to which the image signal is supplied next to the pixel G1 is large. After the image signal is supplied to the signal line 124 connected to the pixel G1, the switch SW3 configured to select the signal line 124 connected to the pixel B1 is turned on, and the image signal is supplied. However, at the point of time when the switch SW3 is turned off, the transition of the signal voltage of the image signal of the signal line 124 connected to the pixel B1 to the desired signal voltage Vb1 is not completed yet because the signal voltage difference between the signal voltage Vg1 and the signal voltage Vb1 is large. Similarly, in the signal lines 124 connected to the pixels R1, G2, and G3, the supply of image signals delays, and the transition to the desired signal voltages Vr1, Vg2, and Vg3 of the image signals is not completed.

Figure 5:
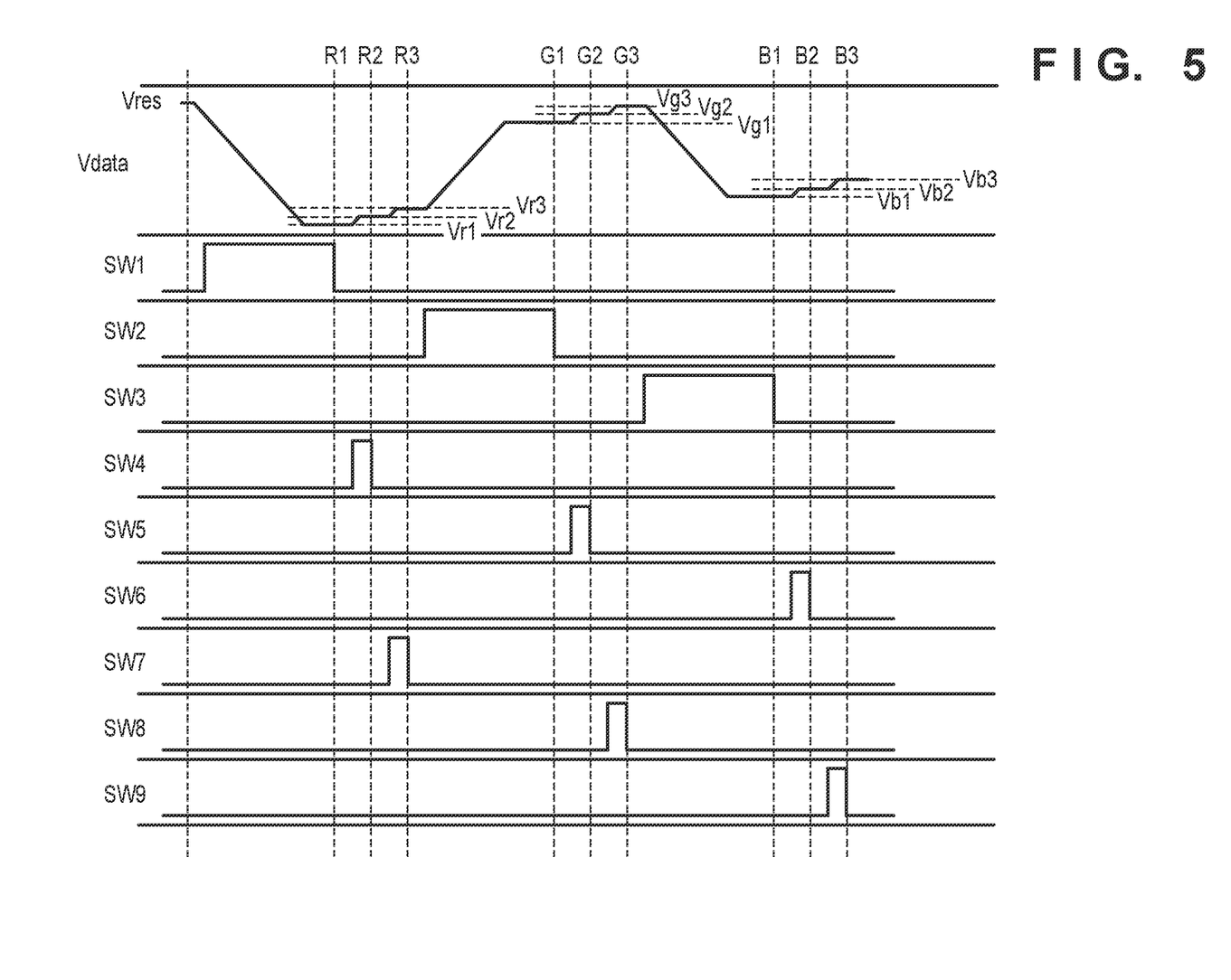
FIG. 5 is a driving timing chart of the display apparatus shown in FIG. 1.

To the contrary, FIG. 5 shows the driving timing chart of the display apparatus 100 according to this embodiment. This is different from the driving method according to the comparative example shown in FIG. 4 in the order of turning on the switches SW1 to SW9 to select the signal lines 124, and the time to select each signal line 124 and supply the image signal. In this embodiment, the selection circuit 200 selects, among the plurality of signal lines 124, the signal lines 124 to supply the image signals in a predetermined order such that the image signals are written in the pixels 110 arranged in the row direction among the plurality of pixels 110. At this time, the selection circuit 200 operates such that the time to select at least one signal line 124 of the plurality of signal lines 124 and supply the image signal becomes different from the time to select a signal line other than the at least one signal line 124 of the plurality of signal lines 124 and supply the image signal. More specifically, as described above, if the adjacent pixels 110 have different emission colors, the difference between the signal voltages of the image signals is large, and if the pixels have the same emission color, the difference between the signal voltages of the image signals is small. For this reason, in the driving method according to this embodiment shown in FIG. 5, the signal lines 124 connected to the pixels 110 are selected in the order of the pixels R1, R2, R3, G1, G2, G3, B1, B2, and B3 such that the image signals are continuously supplied in order to the pixels 110 of the same emission color. When the number of times of switching to a different emission color is minimized, the number of times of shortages in the time of transition of the signal voltage of the image signal supplied to each signal line 124 can be decreased. However, this may be not enough to prevent a shortage in the time of transition of the signal voltage of the image signal to the desired signal voltage in the signal line 124 connected to the pixel G1 or the pixel B1 next to the immediately preceding signal line 124 connected to the pixel 110 of a different emission color to which the image signal is supplied. Hence, in this embodiment, the length of the time to select the signal line 124 to supply the image signal is changed.

More specifically, the plurality of signal lines 124 include the signal lines 124 connected to the pixels (for example, the pixel R3 and the pixel G1) whose emission colors are different from each other in the plurality of pixels 110 and the signal lines 124 connected to the pixels (for example, the pixel R1 and the pixel R2) of the same emission color in the plurality of pixels 110. The selection circuit 200 operates such that the time to select the signal line 124 connected to the pixel G1 in a case in which the signal line 124 connected to the pixel G1 is selected next to the signal line 124 connected to the pixel R3, and the image signal is supplied becomes longer than the time to select the signal line 124 connected to the pixel R2 in a case in which the signal line 124 connected to the pixel R2 is selected next to the signal line 124 connected to the pixel R1, and the image signal is supplied. In other words, the plurality of pixels 110 form pixel groups (a pixel group including the pixels R1, R2, and R3, a pixel group including the pixels G1, G2, and G3, and a pixel group including the pixels B1, B2, and B3) of the pixels 110 of the same emission colors. In the period (one horizontal scanning period described above) to supply the image signal to each of the pixels arranged on one row among the plurality of pixels 110, for each pixel group, each selection circuit 200 selects the signal line 124 to supply the image signal among the plurality of signal lines 124 such that the image signals are written in a predetermined order (in the driving method shown in FIG. 5, the order of arranging in the row direction) in the pixels 110 included in the pixel group. That is, as shown in FIG. 5, when supplying the image signal to the signal line 124 connected to the pixel G1 or the pixel B1 in which the image signal is written at the start of switching to a different emission color, the time to select the signal line 124 and supply the image signal is made long. On the other hand, at the switching to the signal line 124 connected to the pixel 110 of the same emission color, the time to select the signal line 124 and supply the image signal is shortened. In this way, the switching unit 203 of the selection circuit 200 changes the time to select the signal line to supply the image signal in accordance with the order of selecting the signal lines 124 to supply the image signal among the plurality of signal lines 124, more specifically, a change in the emission color of the pixel 110 connected to the selected signal line 124. This can implement more accurate image signal supply and write to each pixel 110.

In addition, as shown in FIG. 5, in one horizontal scanning period in which the image signals are supplied to the pixels 110 arranged on one row among the plurality of pixel 110, the time to select the signal line 124 (the signal line 124 connected to the pixel R1) that is selected first among the plurality of signal lines 124 may be longer than the time to select the signal line 124 (the signal line 124 connected to the pixel R2) that is the second signal line selected among the plurality of signal lines 124. That is, in the arrangement shown in FIG. 5, the selection circuit 200 prolongs the time to supply the image signal to the signal line 124 connected to the pixels R1 in the first column. This is because a case in which the difference between a reset voltage Vres that is a signal voltage held at the time of reset of the signal generation unit 202 and the signal voltage Vr1 of the first column is larger than the voltage difference between the signal voltages of the adjacent pixels 110 of the same emission color is taken into consideration.

When the driving method shown in FIG. 5 is used, it is possible to suppress an error in the signal voltage of the image signal caused by the shortage of time to select the signal line 124 when supplying the image signal and cause each pixel 110 to emit light at a more correct luminance on the display apparatus 100. In addition, when supplying the image signals continuously to the pixels 110 of the same emission color, the time to select the corresponding signal line 124 by the switching unit 203 is made shorter than that when supplying the image signals continuously to the pixels 110 of different emission colors. This can suppress lowering of the frame rate when displaying an image.

Figure 6:
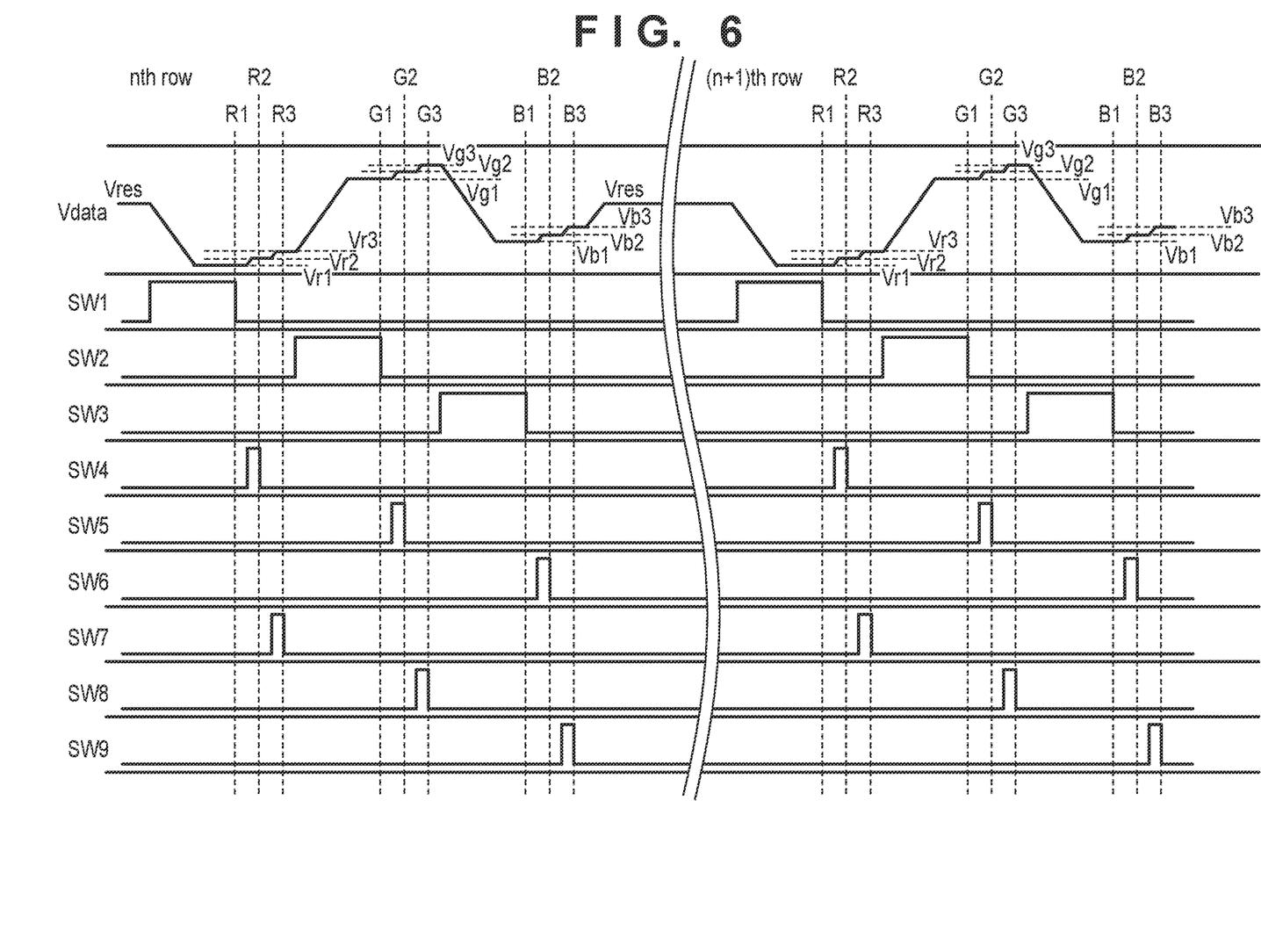
FIG. 6 is a driving timing chart of the display apparatus shown in FIG. 1.

FIG. 6 is a driving timing chart of a modification of the driving method shown in FIG. 5 according to this embodiment. FIG. 6 shows the image signal supply operation in the horizontal scanning periods corresponding to two rows including an arbitrary nth row and an (n+1)th row to be scanned next to the nth row. This driving method is different from the driving method shown in FIG. 5 in that the reset voltage Vres of the signal voltage of the image signal is the intermediate potential between the maximum value and the minimum value of the signal voltage of the image signal. That is, the signal generation unit 202 generates the signal of the signal voltage between the maximum value and the minimum value of the signal voltage of the image signal during the period after the image signal is supplied to each of the pixels 110 arranged on the nth row until the image signal is supplied to each of the pixels 110 arranged on the (n+1)th row. With this driving, in each horizontal scanning period, the time needed for the transition of the signal voltage of the image signal when supplying the image signal to the signal line 124 for the first time can be shortened on average. For this reason, in each row, when writing the image signal in the pixel 110 for the first time, the signal voltage of a more correct image signal can be supplied to the signal line 124. As a result, the more correct image signal can be written in the pixel 110, and an error in the luminance of the pixel 110 can be reduced.

Figure 7:
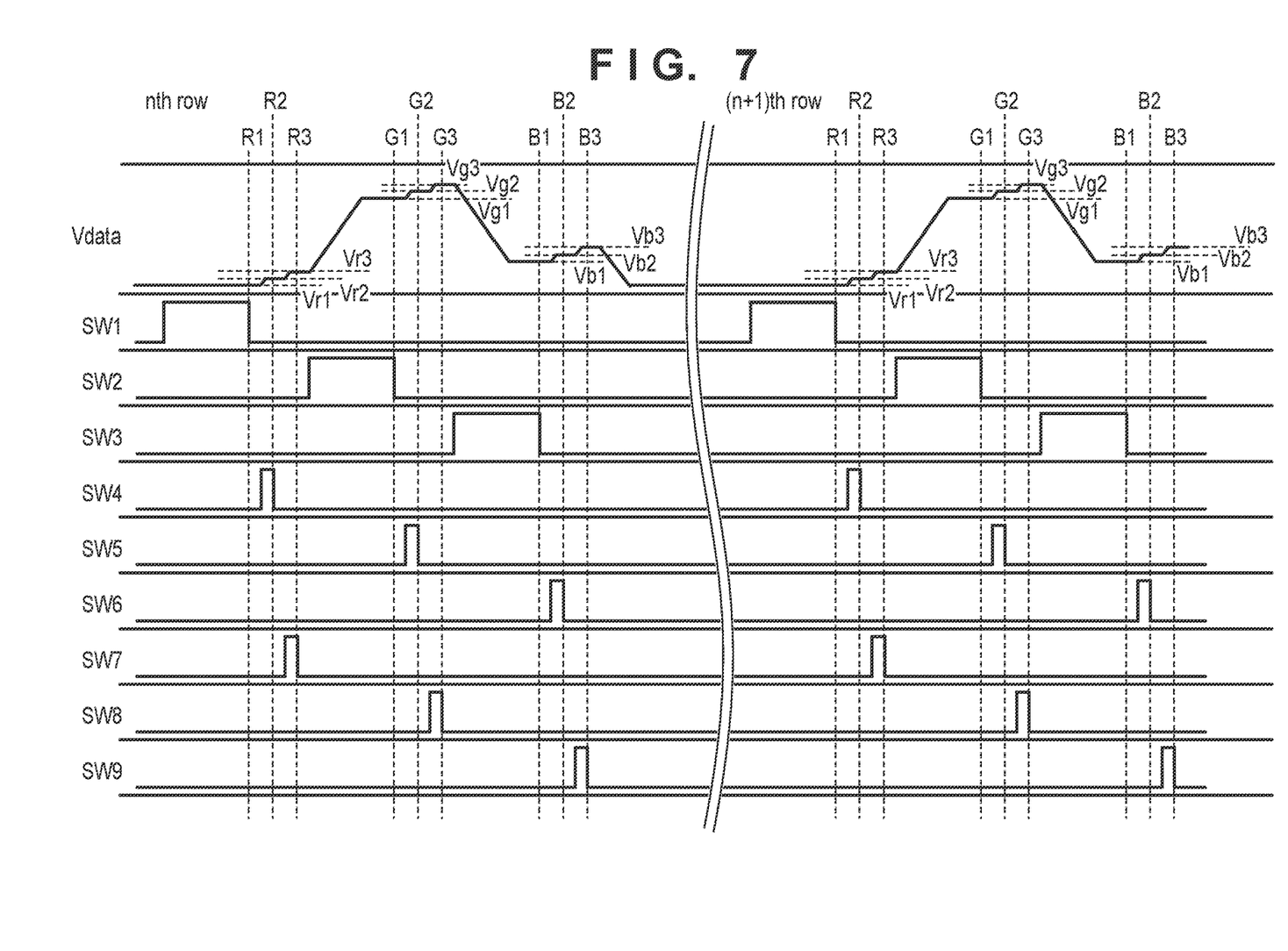
FIG. 7 is a driving timing chart of the display apparatus shown in FIG. 1.

FIG. 7 is a driving timing chart of a modification of the driving method shown in FIG. 6 according to this embodiment. This driving method is different from the driving method shown in FIG. 6 in that the signal generation unit 202 outputs the image signal of the first column in advance before the period in which the switch SW1 configured to supply the image signal of the first column performs the ON operation. That is, the signal generation unit 202 generates the signal of the signal voltage of the image signal of the pixel 110 in which the image signal is to be written first among the pixels 110 arranged on the next (n+1)th row during the period after the image signal is supplied to each of the pixels 110 arranged on the nth row until the image signal is supplied to each of the pixels 110 arranged on the (n+1)th row. With this driving, it is possible to minimize the time needed for the transition of the signal voltage of the image signal when supplying the image signal to the signal line 124 of the first column. For this reason, in each row, when writing the image signal in the pixel 110 on the first column, the signal voltage of a more correct image signal can be supplied to the signal line 124, and an error in the luminance of the pixel 110 can be reduced.

Figure 8:
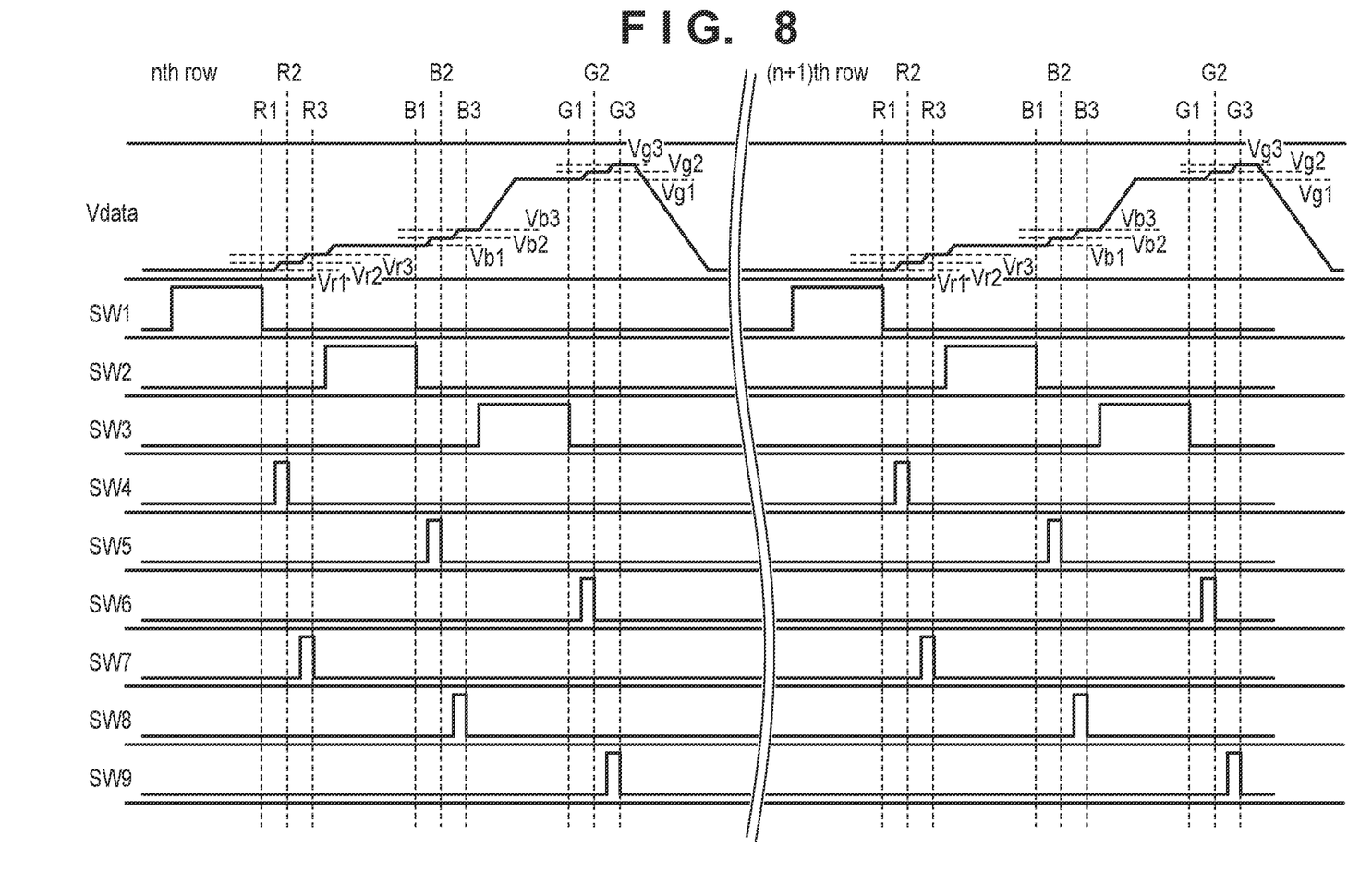
FIG. 8 is a driving timing chart of the display apparatus shown in FIG. 1.

FIG. 8 is a driving timing chart of a modification of the driving method shown in FIG. 7 according to this embodiment. This driving method is different from the driving method shown in FIG. 7 in the order of selecting the signal lines 124 on a pixel group basis in each horizontal scanning period. In the driving method shown in FIG. 7, the signal lines 124 are selected in the order of the pixel group including the pixels R1, R2, and R3, the pixel group including the pixels G1, G2, and G3, and the pixel group including the pixels B1, B2, and B3. On the other hand, in the driving method shown in FIG. 8, the signal lines 124 are selected in the order of the pixel group including the pixels R1, R2, and R3, the pixel group including the pixels B1, B2, and B3, and the pixel group including the pixels G1, G2, and G3, and the image signals are supplied.

In the display apparatus 100, the range of the signal voltage of the image signal sometimes changes depending on the emission color. An example is a case in which there is a difference in the efficiency of emission luminance for a driving current between the emission colors of the light emitting elements using organic EL. In this embodiment, as for the ranges of the signal voltages of pixel signals of the colors, all the three colors have the same maximum voltage. On the other hand, as for the minimum voltages of the signal voltages of the pixel signals of the colors, a relationship given by red (the pixel group including the pixels R1, R2, and R3)<blue (the pixel group including the pixels B1, B2, and B3)<green (the pixel group including the pixels G1, G2, and G3) holds. For this reason, the order to medians in the ranges of the signal voltages of the colors is represented by red<blue<green. When supplying signal voltages in order for each pixel group of the same emission color, the difference between the signal voltages of the image signals in each pixel group can be made small on average by supplying the signal voltages in order such that the difference between the medians in the ranges of the signal voltages of the image signals becomes small. Hence, if it is assumed that the times to supply image signals are the same, the driving method shown in FIG. 8 can supply a more correct image signal in many cases as compared to FIG. 7 because the difference of signal voltage between the pixel groups can be small. In the driving method shown in FIG. 7, since the image signals are supplied to the pixel groups in the order of red, green, and blue, the medians in the ranges of the signal voltages of the image signals are small, large, and medium in terms of the magnitude relationship. Hence, the difference of the signal voltage of the image voltage is considered to become large at the timing of switching from the signal line 124 to supply the image signals to the pixel group of the red emission color to the signal line 124 to supply the image signals to the pixel group of the green emission color. In the driving method shown in FIG. 8, the signal lines to supply the image signals are selected in the order of red pixel group, blue pixel group, and green pixel group, thereby changing the magnitude relationship of the medians in the ranges of the signal voltages of the image signals to small, medium, and large in this order. For this reason, when supplying the image signals to a pixel group of a different emission color, the difference of the signal voltage of the image signal becomes small, and the signal voltage of a more correct image signal can be supplied to the signal line 124 when supplying the image signal to the signal line 124 in the same time. This can reduce an error in the luminance of the pixel 110 with respect to a desired luminance.

In the driving method shown in FIG. 8, the pixel groups to supply the image signals are selected in order such that the medians in the ranges of the signal voltages of the image signals are small, medium, and large in terms of the magnitude relationship. However, the medians may be large, medium, and small in terms of the magnitude relationship. The selection circuit 200 appropriately selects the pixel groups in order in accordance with the magnitude relationship of the medians in the ranges of the signal voltages of the image signals. Additionally, in the above description, the medians in the ranges of the signal voltages of the image signals become large in the order of red, blue, and green. However, if the magnitude relationship of the medians in the ranges of the signal voltages changes depending on the emission efficiency of each color, or the like, the order of the pixel groups to supply the image signals may appropriately be changed.

Figure 9:
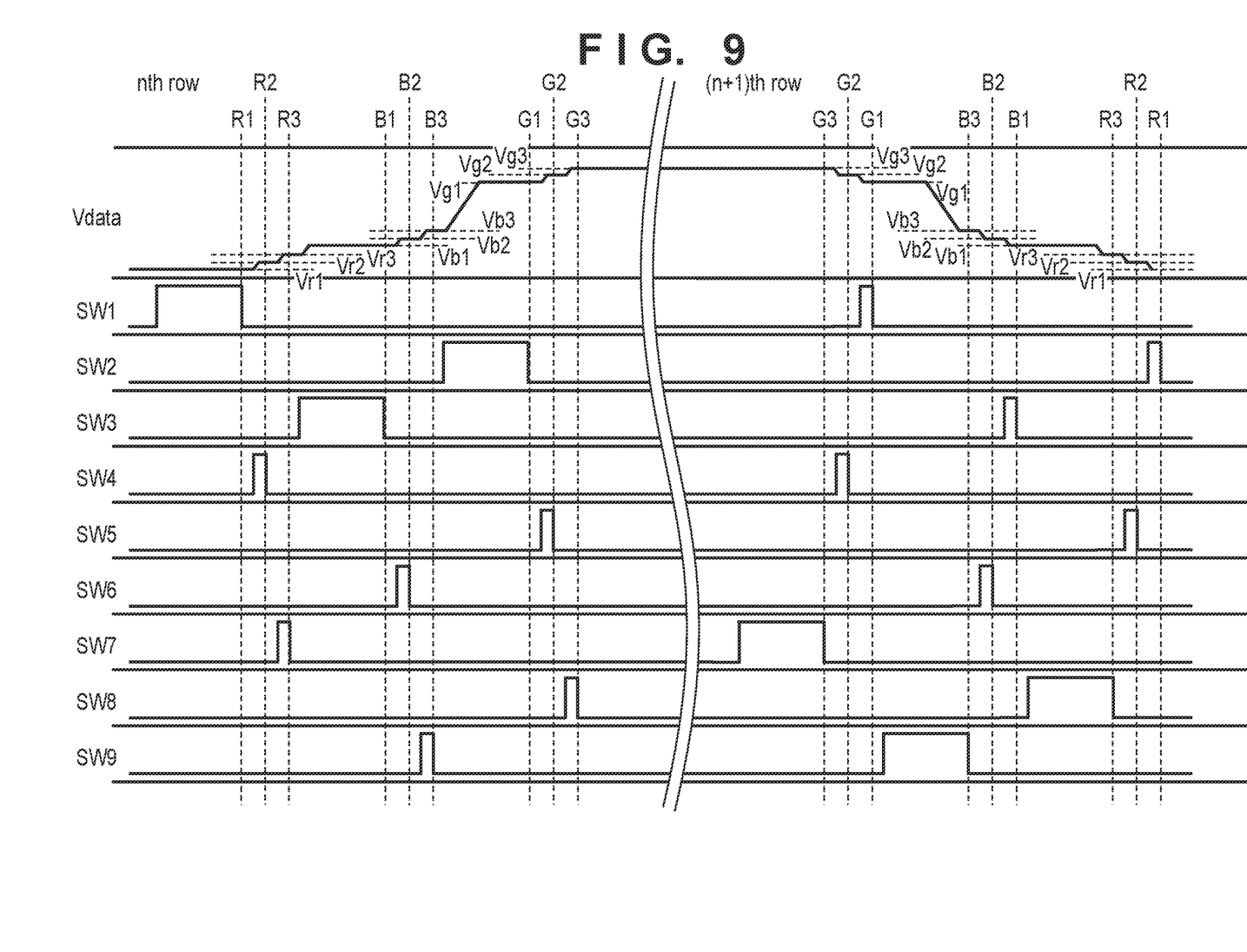
FIG. 9 is a driving timing chart of the display apparatus shown in FIG. 1.

FIG. 9 is a driving timing chart of a modification of the driving method shown in FIG. 8 according to this embodiment. This driving method is different from the driving method shown in FIG. 8 in that the signal lines 124 to supply the image signals are selected in different orders among the plurality of signal lines 124 in the nth row and the (n+1)th row. In the driving method shown in FIG. 9, the selection circuit 200 selects the signal lines 124 to supply the image signals in reverse orders among the plurality of signal lines 124 in the nth row and the (n+1)th row to supply the image signals next to the nth row. That is, in the nth row, the image signals are supplied in order to the signal lines 124 connected to the pixels R1, R2, R3, B1, B2, B3, G1, G2, and G3. On the other hand, in the (n+1)th row, the image signals are supplied in order to the signal lines 124 connected to the pixels G3, G2, G1, B3, B2, B1, R3, R2, and R1. In this way, the selection circuit 200 selects the signal lines 124 to supply the image signals such that the emission color of the pixel in which the image signal is to be written finally in the nth row is the same as the emission color of the pixel in which the image signal is to be written first in the (n+1)th row. With this driving, the column to which the image signal is supplied finally in the nth row and the column to which the image signal is supplied first in the (n+1)th row include the pixels 110 of the same emission color which are adjacent in the row direction, and the difference of the signal voltage of the image signal when write-accessing the first column can be made smaller. In FIG. 9, the selection circuit 200 selects the signal lines 124 such that the image signals are supplied in reverse orders in the nth row and the (n+1)th row to supply the image signals next to the nth row. However, the present invention is not limited to this. For example, in the nth row, the image signals may be supplied in order to the signal lines 124 connected to the pixels R1, R2, R3, B1, B2, B3, G1, G2, and G3. On the other hand, in the (n+1)th row, the image signals may be supplied in order to the signal lines 124 connected to the pixels G1, G2, G3, B1, B2, B3, R1, R2, and R3.

Figure 10:
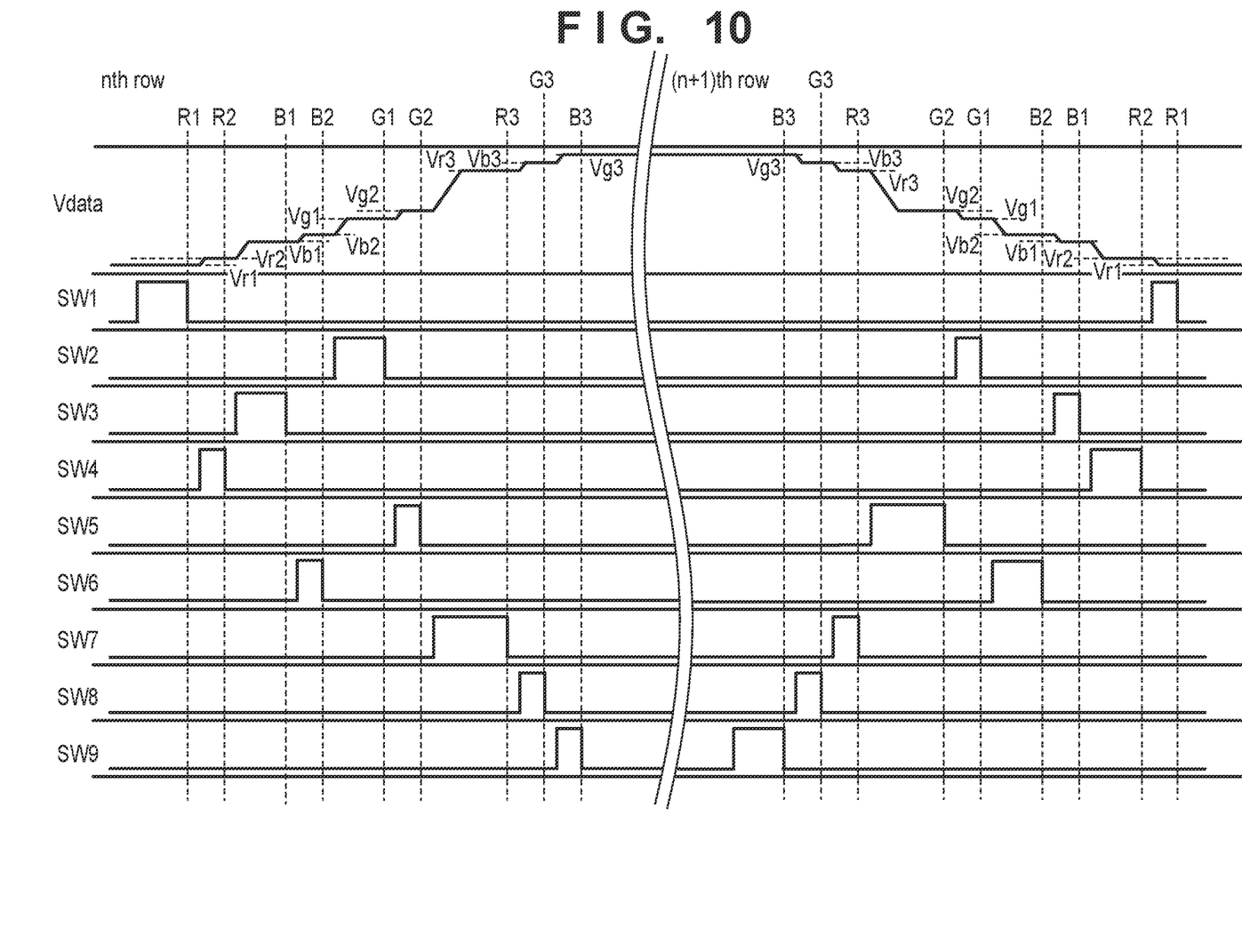
FIG. 10 is a driving timing chart of the display apparatus shown in FIG. 1.

FIG. 10 is a driving timing chart of the display apparatus 100 different from the above-described driving methods according to this embodiment. In the driving methods shown in FIGS. 5 to 9 described above, the selection circuit 200 supplies the image signals in order to the signal lines 124 for each pixel group of the same emission color. On the other hand, in the driving method shown in FIG. 10, the selection circuit 200 selects the signal line 124 to supply the image signal among the plurality of signal lines 124 such that the image signal is written in each of the plurality of pixels 110 in an order according to the magnitude of the signal voltage of the image signal. That is, the selection circuit 200 selects the signal line 124 to supply the image signal such that the difference between the signal voltages of the image signals that are continuously supplied becomes small. Additionally, as shown in FIG. 10, the image signals may be supplied in such an order that minimizes the difference of the signal voltage not only between the columns in the horizontal period of one row but also between the column to which the image signal is supplied finally in the nth row and the column to which the image signal is supplied first in the next (n+1)th row.

Furthermore, the switching unit 203 of the selection circuit 200 may change the time to select the signal line 124 to supply the image signal in accordance with a change in the signal voltage of the image signal supplied to the signal line 124 continuously selected among the plurality of signal lines 124. For example, in FIG. 10, consider the signal line connected to the pixel G2 and the signal line connected to the pixel R3 to which the image signal is supplied next to the pixel G2, and the signal line connected to the pixel G3 and the signal line connected to the pixel B3 to which the image signal is supplied next to the pixel G3. At this time, the difference between the signal voltage of the image signal supplied to the signal line connected to the pixel G2 and the signal voltage of the image signal supplied to the signal line connected to the pixel R3 is larger than the difference between the signal voltage of the image signal supplied to the signal line connected to the pixel G3 and the signal voltage of the image signal supplied to the signal line connected to the pixel B3. In this case, the time to select the signal line connected to the pixel R3 and supply the image signal may be longer than the time to select the signal line connected to the pixel B3 and supply the image signal.

In this way, if the relationship of the signal voltages of the desired image signals to be supplied to the signal lines 124 can be fed back in advance to the driving of the selection circuit 200, the selection circuit 200 adjusts the time to supply the image signal to each signal line 124. This makes it possible to suppress an error in the emission luminance of each pixel 110 and also suppress lowering of the frame rate.

Additionally, the adjustment of the time to supply the image signal is not limited between the columns in the same row. For example, the times to select the signal lines 124 of the same column on rows different from each other may be different from each other. That is, times to select the signal lines 124 may be different from each other between the first column of the nth row and the first column of the (n+1)th row. When considering not only the period between columns or between rows but also a frame period to supply one image, the order or time to supply the image signals to the pixels 110 may change between frame periods different from each other. That is, in the nth frame, in the nth row, the signal lines 124 connected to the pixels 110 receive supply of the image signals in an order of pixels R1, R2, B1, B2, G1, G2, R3, G3, and B3. In the next (n+1)th frame, in the nth row, the signal lines 124 connected to the pixels 110 may receive supply of the image signals in an order of pixels R1, G1, B1, R2, R3, G2, G3, B2, and B3.

According to some embodiments of the present invention, it is possible to provide a technique advantageous in displaying an image on a display apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-095634, filed May 17, 2018, which is hereby incorporated by reference herein in its entirety.

What is claimed is:

1. A display apparatus in which a plurality of selection circuits and a plurality of display blocks are arranged such that one display block corresponds to one selection circuit,
    wherein each of the plurality of display blocks includes a plurality of signal lines extending in a column direction, and a plurality of pixels connected to the plurality of signal lines and arranged in a matrix in the column direction and in a row direction crossing the column direction,
    wherein each of the plurality of selection circuits selects a signal line in a predetermined order to supply an image signal among the plurality of signal lines such that the image signal is written in each of the pixels arranged in the row direction among the plurality of pixels, and
    wherein a length of a time during which at least one signal line among the plurality of signal lines is selected and the image signal is supplied to the at least one signal line is different from a length of a time during which a signal line other than the at least one signal line among the plurality of signal lines is selected and the image signal is supplied to the signal line other than the at least one signal line.

2. The apparatus according to claim 1, wherein each of the plurality of selection circuits includes a switching unit configured to select a signal line to supply the image signal among the plurality of signal lines, and
    wherein the switching unit changes a time to select the signal line to supply the image signal among the plurality of signal lines in accordance with at least one of an order to select the signal line to supply the image signal among the plurality of signal lines and a change in a signal voltage between the image signals supplied to signal lines continuously selected among the plurality of signal lines.

3. The apparatus according to claim 1, wherein the plurality of signal lines include a first signal line and a second signal line, which are connected to pixels whose emission colors are different from each other among the plurality of pixels, and a third signal line and a fourth signal line, which are connected to pixels whose emission colors are the same among the plurality of pixels, and
    wherein a time to select the second signal line in a case in which the second signal line is selected next to the first signal line and the image signal is supplied is longer than a time to select the fourth signal line in a case in which the fourth signal line is selected next to the third signal line and the image signal is supplied.

4. The apparatus according to claim 3, wherein the plurality of pixels form pixel groups each including pixels of the same emission color, and
wherein in a period in which the image signal is supplied to each of the pixels arranged on one row among the plurality of pixels, each of the plurality of selection circuits selects the signal line to supply the image signal among the plurality of signal lines such that the image signal is written in each of the pixels included in each pixel group in a predetermined order.

5. The apparatus according to claim 4, wherein a range of the signal voltage of the image signal changes between the pixel groups, and
wherein in the period in which the image signal is supplied to each of the pixels arranged on one row among the plurality of pixels, each of the plurality of selection circuits selects the pixel group in order in accordance with a median in the range of the signal voltage of the image signal.

6. The apparatus according to claim 3, wherein when supplying the image signal to each of pixels arranged on a first row and arranged in the row direction among the plurality of pixels and pixels arranged on a second row different from the first row, each of the plurality of selection circuits selects the signal line to supply the image signal among the plurality of signal lines in a different order between the first row and the second row.

7. The apparatus according to claim 6, wherein each of the plurality of selection circuits supplies the image signal to the second row next to the first row, and selects the signal line to supply the image signal among the plurality of signal lines such that the emission color of a pixel in which the image signal is written finally in the first row among the plurality of pixels and the emission color of a pixel in which the image signal is written first in the second row among the plurality of pixels become the same emission color.

8. The apparatus according to claim 6, wherein each of the plurality of selection circuits selects the signal line to supply the image signal among the plurality of signal lines in reverse orders in the first row and the second row.

9. The apparatus according to claim 1, wherein each of the plurality of selection circuits selects a signal line to supply the image signal among the plurality of signal lines such that the image signal is written in each of the plurality of pixels in an order according to a magnitude of a signal voltage of the image signal,
wherein the plurality of signal lines include a first signal line and a second signal line to which the image signal is supplied next to the first signal line, and a third signal line and a fourth signal line to which the image signal is supplied next to the third signal line,
wherein a difference between the signal voltage of the image signal supplied to the first signal line and the signal voltage of the image signal supplied to the second signal line is larger than a difference between the signal voltage of the image signal supplied to the third signal line and the signal voltage of the image signal supplied to the fourth signal line, and
wherein a time to select the second signal line and supply the image signal is longer than a time to select the fourth signal line and supply the image signal.

10. The apparatus according to claim 1, wherein the plurality of pixels include pixels arranged on a third row and arranged in the row direction and pixels arranged on a fourth row different from the third row, and
wherein a time to select a signal line of a first column among the plurality of signal lines to supply the image signal to a pixel arranged on the third row and a time to select the signal line of the first column among the plurality of signal lines to supply the image signal to a pixel arranged on the fourth row are different from each other.

11. The apparatus according to claim 1, wherein each of the plurality of selection circuits includes a signal generation unit, and
wherein during a period after each of the plurality of signal lines is selected, and the image signal is supplied such that the image signal is written in each of the pixels arranged on one row among the plurality of pixels until each of the plurality of signal lines is selected, and the image signal is supplied such that the image signal is written in each of the pixels arranged on a next row, the signal generation unit generates a signal of a signal voltage between a maximum value and a minimum value of a signal voltage of the image signal.

12. The apparatus according to claim 1, wherein each of the plurality of selection circuits includes a signal generation unit, and
wherein during a period after each of the plurality of signal lines is selected, and the image signal is supplied such that the image signal is written in each of the pixels arranged on one row among the plurality of pixels until each of the plurality of signal lines is selected, and the image signal is supplied such that the image signal is written in each of the pixels arranged on a next row, the signal generation unit generates a signal of a signal voltage of the image signal for a pixel in which the image signal is written first among the pixels arranged on the next row.

13. The apparatus according to claim 1, wherein during a period to supply the image signal to each of the pixels arranged on one row among the plurality of pixels, a time to select a signal line which is to be selected first among the plurality of signal lines is longer than a time to select a signal line which is to be selected second among the plurality of signal lines.

* * * * *